(12) United States Patent
Harada et al.

(10) Patent No.: US 7,125,806 B2
(45) Date of Patent: Oct. 24, 2006

(54) ETCHING METHOD

(75) Inventors: Akitoshi Harada, Yamanashi (JP); Koichiro Inazawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/490,107

(22) PCT Filed: Sep. 6, 2002

(86) PCT No.: PCT/JP02/09129

§ 371 (c)(1), (2), (4) Date: Mar. 25, 2004

(87) PCT Pub. No.: WO03/030237

PCT Pub. Date: Aug. 10, 2003

(65) Prior Publication Data

US 2004/0209469 A1    Oct. 21, 2004

(30) Foreign Application Priority Data

Sep. 26, 2001  (JP) ............................. 2001-295186

(51) Int. Cl.
*H01L 21/461* (2006.01)
*H01L 21/302* (2006.01)

(52) U.S. Cl. ............... 438/706; 438/710; 438/714; 438/725

(58) Field of Classification Search ........ 438/622–637, 438/706, 710, 714, 717, 725
See application file for complete search history.

(56) References Cited

U.S. PATENT DOCUMENTS

| 6,180,518 | B1 | 1/2001 | Layadi et al. | |
|---|---|---|---|---|
| 6,251,774 | B1 | 6/2001 | Harada et al. | |
| 6,632,707 | B1 * | 10/2003 | Wang et al. | 438/110 |
| 6,683,002 | B1 * | 1/2004 | Chooi et al. | 438/687 |
| 2002/0111036 | A1 * | 8/2002 | Zhu et al. | 438/754 |
| 2002/0182874 | A1 * | 12/2002 | Wang | 438/706 |
| 2002/0182881 | A1 * | 12/2002 | Ni et al. | 438/725 |

FOREIGN PATENT DOCUMENTS

| EP | 1030353 | 8/2000 |
|---|---|---|
| JP | 2000-36484 | 2/2000 |
| JP | 2001-118825 | 4/2001 |

OTHER PUBLICATIONS

Fukasawa et al., "Organic Low-k Film Etching Using N-H Plasma", Proc. of Symposium on Dry Process 1999, pp. 221 to 226, particularly, pp. 222, 223; Fig. 9.

* cited by examiner

*Primary Examiner*—Duy-Vu N Deo
(74) *Attorney, Agent, or Firm*—Oblon, Spivak, McClelland, Maier & Neustadt, P.C.

(57) ABSTRACT

An etching method comprises a step of forming a via hole structure based on a photoresist film layer (210) for forming a wiring pattern, a silicon oxide film layer (201) which is a hard mask layer formed under the photoresist film, and an organic Low-k film layer (203) formed under the hard mask layer, wherein in the step, the organic film layer and the organic Low-k film layer are etched by using a mixture gas of $N_2$ gas, $H_2$ gas, and a CF gas.

12 Claims, 7 Drawing Sheets

ETCHING METHOD

FIELD OF THE INVENTION

The present invention relates to an etching method; and, more particularly, to an etching method for etching a resist layer for use in forming a wiring pattern; an antireflection film layer; and an organic Low-k film layer serving as an interlayer insulating film in, for example, a multi-layer wiring forming process.

BACKGROUND OF THE INVENTION

As semiconductor circuits are highly integrated, fabrication of semiconductor devices having a multi-layer wiring structure is being rapidly developed. For the semiconductor devices having the multi-layer wiring structure, a trench wiring for interconnecting components arranged in horizontal directions as well as a via hole wiring for interconnecting components stacked in a vertical direction should be formed. Employed as such a multi-layer wiring structure is a dual damascene structure. Recently, a highly electromigration resistant metal having a low resistance, e.g., copper, is used as a wiring material and an organic Low-k material capable of ensuring a low dielectric constant, e.g., a SILK (manufactured by The Dow Chemical Company), is employed as an interlayer insulating material.

Figure 6A:
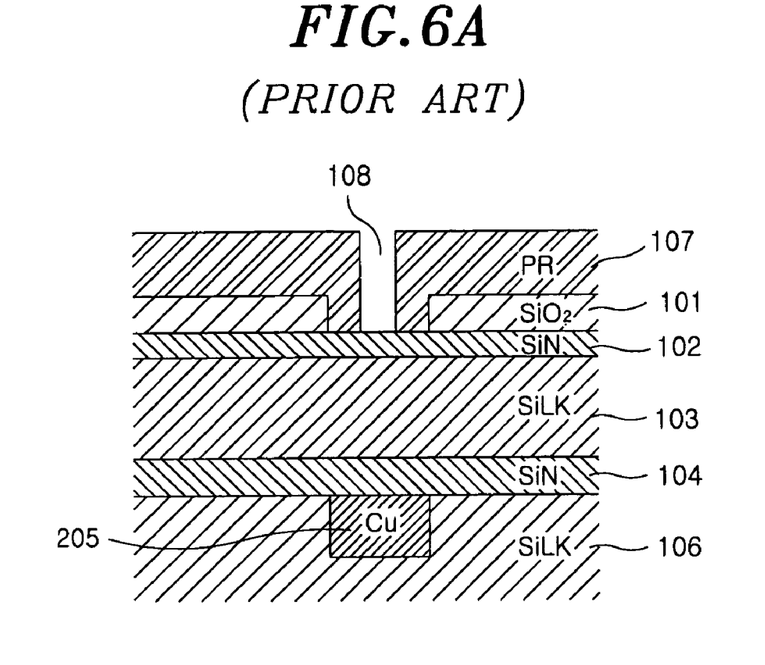
FIGS. 6A to 6C show cross sectional views showing a process for forming a hard mask for use in forming a via hole in according to the conventional etching method.
Figure 6B:
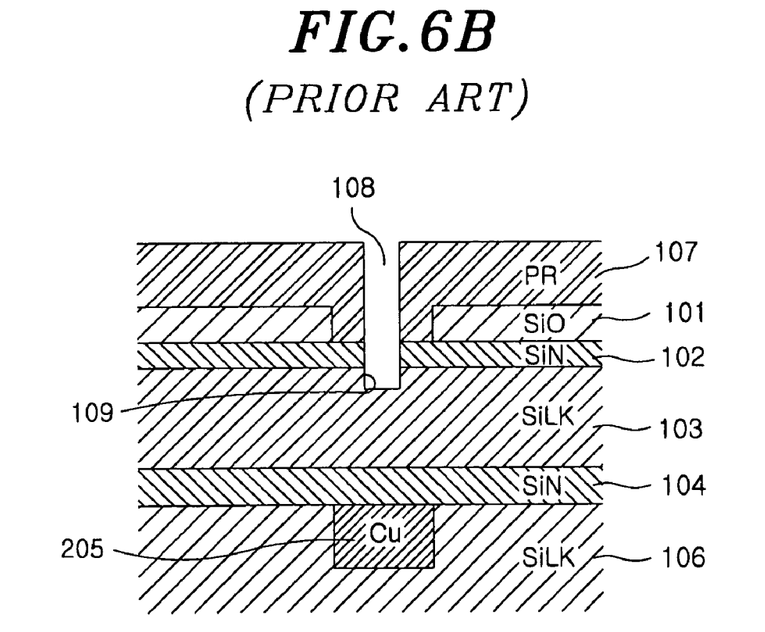
Figure 6C:
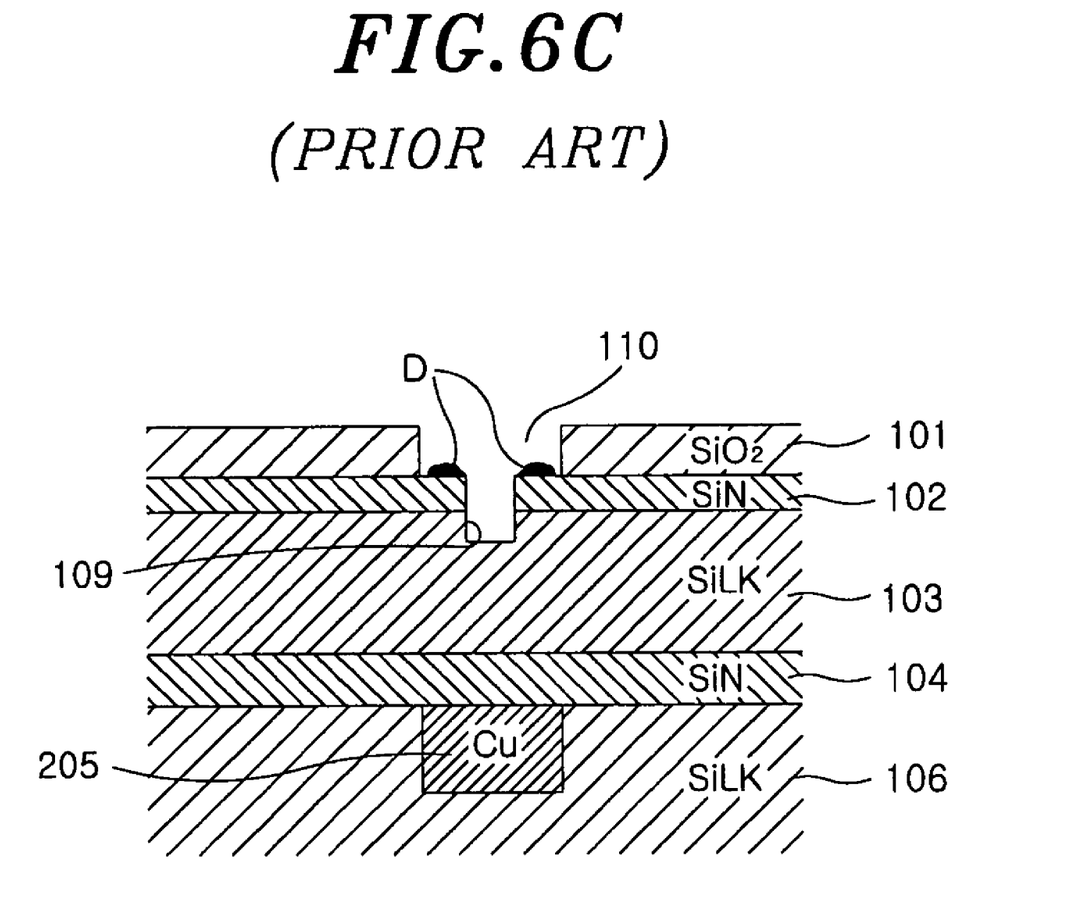

FIGS. 6A to 6C illustrate an exemplary process of forming a shoulder portion of a via hole of a dual damascene structure by using a photoresist (PR) layer for via hole formation. Formed on, e.g., a wafer for a formation of the dual damascene structure are a silicon oxide film layer ($SiO_2$ film layer) 101, a silicon nitride film layer (SiN film layer) 102, an organic Low-k film layer (e.g., SiLK film layer) 103, a SiN film layer 104 and a SiLk film layer, in which a Cu wiring layer (Cu layer) 105 of a lower layer circuit pattern is formed, as shown in FIG. 6C. Herein, the $SiO_2$ film layer 101 and the silicon nitride film layer (SiN film layer 102) are formed to serve as a first hard mask layer and a second hard mask layer, respectively, for use in forming a via and a trench. The SiLK film layer 103 is formed as an interlayer insulating film layer and the SiN film layer 104 formed underneath the SiLK film layer 103 serves as a stopper for use in forming the via hole. Formed on top of the stack of such layers is a photoresist film layer (PR layer) 107 having a pattern for use in forming the via hole.

In case of forming the via hole in the SiLK film layer 103, by using a gas (e.g., a gaseous mixture of a $CF_4$ gas, an Ar gas and an $O_2$ gas) capable of etching the SiN film layer 102 and the SiLK film layer 103, the SiN film layer 102 is etched according to a via hole pattern 108 of the PR layer 107 shown in FIG. 6A and then the SiLK film layer 103 is overetched down to a predetermined depth, e.g., at least a depth corresponding to a shoulder portion of the dual damascene structure (see FIG. 6B). Thereafter, an etching (ashing) process is performed on the PR layer 107 by employing an etching gas (e.g., a gaseous mixture of a $N_2$ gas and a $H_2$ gas) having a high selectivity against both the $SiO_2$ film layer 101 and the SiN film layer 102. During this process, the PR layer 107 is removed and, at the same time, the SiLK film layer 103 is etched by using the $SiO_2$ film layer 101 and the SiN film layer 102 as a hard mask, thereby deepening the via hole 108.

However, in case of simultaneously etching the PR layer 107 for use in the formation of the via hole and the SiLK film layer 103 serving as the interlayer insulating film layer by using the gaseous mixture of $N_2$ gas and $H_2$ gas as in the prior art, there remain resist residues D on a trench portion 110 (on the SiN film layer 102) formed in etching the $SiO_2$ film layer 101 as shown in FIG. 6C. This results in a poor etching profile of the SiN film layer 102 generated during a subsequent etching process thereof due to the resist residues, which in turn causes etching residues in a following etching process of the SiN film layer 103. Particularly, when an antireflection film layer is provided underneath the PR layer 107, a greater amount of resist residues tends to remain after the etching.

SUMMARY OF THE INVENTION

It is, therefore, an object of the present invention to provide a method capable of etching an organic interlayer insulating film layer in a desired shape without generating resist residues when etching a resist film layer or an organic film layer, e.g., an organic interlayer insulating layer, during a process of forming a wiring.

To achieve the above-mentioned object, in one embodiment the invention provides a method for etching an organic film layer by employing a gaseous mixture of a $N_2$ gas, a $H_2$ gas and a CF-base gas as an etching gas.

The invention further includes a method for etching an organic film layer by employing a gaseous mixture of a gas including N and H, a CF-based gas and an $O_2$ gas as an etching gas.

The invention further includes a method wherein, in a via hole structure forming process based on an organic film layer for use in fabricating a wiring pattern, a hard mask layer formed underneath the organic film layer and an organic Low-k film layer formed below the hard mask layer, the organic film layer and the organic Low-k film layer are etched by using the etching gas.

The invention further includes a method wherein, in a trench structure forming process based on an organic film layer for use in fabricating a wiring pattern, a hard mask layer formed underneath the organic film layer and an organic Low-k film layer formed below the hard mask layer, the organic film layer and the organic Low-k film layer are etched by using the etching gas.

The invention further provides a method wherein, in a process for forming a dual damascene structure based on an organic film layer for use in fabricating a wiring pattern, a hard mask layer formed underneath the organic film layer and an organic Low-k film layer formed below the hard mask layer, the organic film layer and the organic Low-k film layer are etching by using the etching gas.

The invention further provides a method wherein the organic film layer includes a resist film layer and an antireflection film layer.

The invention further provides a method wherein the hard mask layer includes a silicon nitride film layer.

The invention further provides a method wherein the CF-based gas is $CH_3F$.

The invention further provides a method wherein the gas including N and H is $NH_3$.

The invention further provides a method wherein employed as the etching gas is a gaseous mixture of $NH_3$, $CH_3F$ and $O_2$ and a flow rate ratio of $O_2/NH_3$ is larger than 10/1500 and smaller than 300/1500.

The invention further provides a method wherein the organic film layer is without leaving residues thereof.

The invention further provides a method wherein a via hole is formed in the organic Low-k film layer.

The invention further provides a method wherein a part of the via hole is left.

DETAILED DESCRIPTION OF THE PREFERRED EMBODIMENTS

Preferred embodiments of the present invention will now be described in detail with reference to FIGS. 1 to 5.

Figure 1:
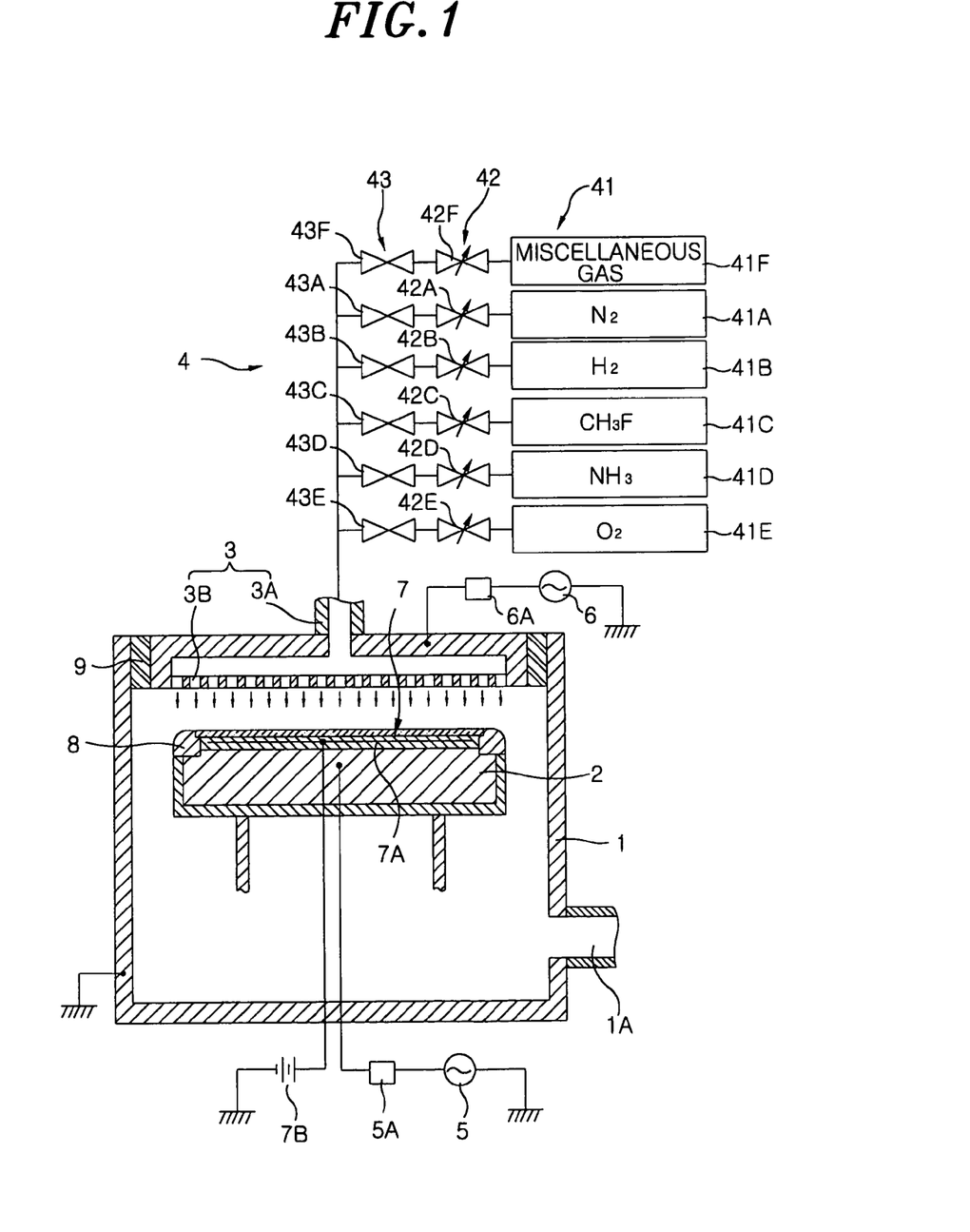
FIG. 1 is a cross sectional view of a plasma processing device for use in an etching method in accordance with the present invention.

Referring to FIG. 1, there is provided a schematic cross sectional view of a plasma processing device for use in performing an etching method in accordance with the present invention. As shown in FIG. 1, the plasma processing device is of a parallel plate type and includes a frame-grounded processing vessel (chamber) 1; a lower electrode 2 constituting a susceptor and installed inside the chamber 1 so as to be vertically moved; a hollow-shaped upper electrode 3 forming a ceiling portion of the chamber 1 above the lower electrode 2 and forming a supply unit of an etching gas; a gas supplying system 4 for supplying plural species of etching gases, the gas supply system 4 being connected to a gas inlet opening 3A formed at a central portion of an upper surface of the upper electrode 3; and a gas exhausting system (not shown) connected to a gas exhaust port 1A of the chamber 1. The plasma processing device etches a wafer W mounted on the lower electrode 2 by using a plasma generated between the upper electrode 3 and the lower electrode 2 while supplying an appropriate etching gas into the chamber 1 from the gas supply system 4 and concurrently maintaining the inside of the chamber at a predetermined vacuum level via the gas exhausting system.

Connected to the lower electrode 2 via a matching unit 5A is a first high frequency power supply 5 having a frequency of, e.g., 2 MHz, wherein a bias potential is generated on the wafer W placed on the lower electrode 2 by applying thereto a predetermined high frequency power from the first high frequency power supply 5. Connected to the upper electrode 3 via a matching unit 6A is a second high frequency power supply 6 having a frequency of, e.g., 60 MHz and the plasma of the etching gas is generated between the lower electrode 2 and the upper electrode 3 as described above by applying a predetermined high frequency power to the upper electrode 3 from the second high frequency power supply 6.

Disposed on an upper surface of the lower electrode 2 is a ceramic electrostatic chuck 7 including an electrode plate 7A embedded therein and the electrode plate 7A is connected to a high voltage DC power supply 7B of, e.g., 2.5 kV. The electrostatic chuck 7 electrostatically adsorbs the wafer W by a Coulombic force generated on the surface thereof by applying a DC high voltage from the high voltage DC power supply 7B to the electrode plate 7A. A focus ring 8 is disposed on the upper surface of the lower electrode 2 around the electrostatic chuck 7 and the plasma is concentrated on the surface of the wafer W on the lower electrode 2 by the focus ring 8. Further, the lower electrode 2 incorporates therein a cooler unit or a heater unit (both not shown), through which a temperature of the lower electrode 2 is controlled to range from −20° C. to +80° C. Also, formed in the lower electrode 2 and the electrostatic chuck 7 is a gas channel (not shown) for discharging a backside gas, e.g., a He gas, toward the wafer W mounted on the electrostatic chuck 7, thereby increasing a heat conduction rate between the lower electrode 2 and the wafer W. Further, a multiplicity of inlet holes 3B is uniformly distributed throughout an entire bottom surface of the upper electrode 3. The etching gas introduced into the upper electrode 3 from the gas supply system 4 is uniformly supplied into the chamber 1 via the inlet holes 3B. Further, the upper electrode 3 is insulated from the chamber 1 via an insulating member 9.

As shown in FIG. 1, the gas supply system 4 includes a gas supply source unit 41 for supplying plural speices of etching gases, a mass flow controller unit 42 and an opening/closing valve unit 43 corresponding to the gas supply source unit 41. In the preferred embodiment, the gas supply source unit 41 includes for example a $N_2$ gas supply source 41A, a $H_2$ gas supply source 41B, a $CH_3F$ gas supply source 41C, a $NH_3$ gas supply source 41D, an $O_2$ gas supply source 41E and a miscellaneous gas supply source 41F. Further, the mass flow controller unit 42 includes mass flow controllers 42A to 42F corresponding to the gas supply sources 41A to 41F, respectively, and the opening/closing valve unit 43 includes opening/closing valves 43A to 43F corresponding to the gas supply sources 41A to 41F, respectively. A predetermined etching gas is supplied by appropriately switching over in the gas supply source unit 41 corresponding to etching target.

In accordance with the etching method of the present invention, when etching a SiLK film layer and a photoresist (PR) film layer for use in forming a via hole in a process of forming a dual damascene structure in an organic Low-k film layer (for example, a SiLK film layer), a gaseous mixture of a gas containing N and H, a CF-based gas and an $O_2$ gas or a gaseous mixture of a $N_2$ gas, a $H_2$ gas and a CF-based gas is supplied as an etching gas from the gas supply source unit 41 as will be described in detail later. In case of etching a hard mask layer such as an oxide film layer ($SiO_2$ film layer) or a nitride film layer (SiN film layer), the miscellaneous gas supply source 42F is employed. Further, in FIG. 1, other species of etching gases which can be used in etching processes other than those in accordance with the etching method of the present invention are illustrated as being supplied from the single unified miscellaneous gas supply source 41F.

Next, with reference to FIGS. 2A to 5, there will be described a preferred embodiment of the etching method using the plasma processing device in accordance with the present invention. Though FIGS. 2A to 5 show the whole processes for forming a trench and a via hole of a dual damascene structure, features of the etching method in accordance with the preferred embodiment reside in a process for further etching a via hole already formed in a SiLK film layer while concurrently ashing the PR layer as shown in FIGS. 3B and 3C. Thus, the process for forming the trench and the via hole of the dual damascene structure will now be described.

Figure 2A:
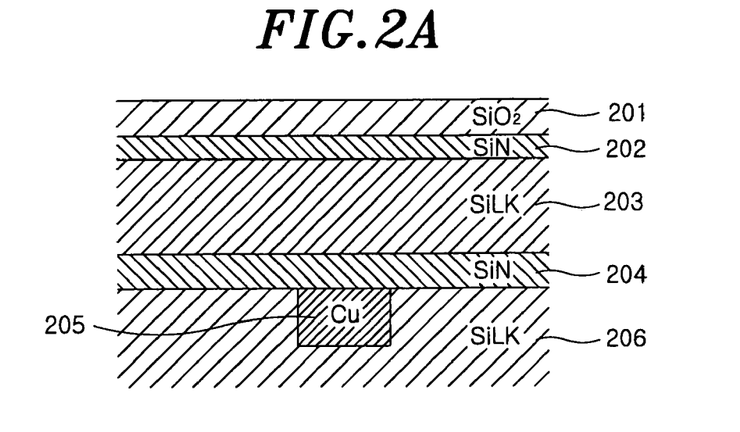
FIGS. 2A to 2C provide cross sectional views showing a process for forming a hard mask for use in forming a trench by using the plasma processing device shown in FIG. 1.

For example, as shown in FIG. 2A, formed from top to bottom in respective thicknesses on a wafer, on which a dual damascene structure is to be formed, are a $SiO_2$ film layer 201 (film thickness : e.g., about 100 nm) and a SiN film layer 202 (film thickness : e.g., about 50 nm) serving as a first and a second hard mask layer, respectively; an organic Low-k film layer 203 (e.g., a SiLK film layer) (film thickness: e.g., about 550 nm); a SiN film layer 204 serving as a stopper; and a SiLK film layer 206 incorporating therein a Cu wiring layer 205 (Cu layer) of an lower layer circuit pattern.

A material for the organic Low-k film layer is not limited to a specific one. Appropriately employed in lieu of SiLK can be, e.g., polyfluoronaphthalene polymer, maleimide benzocyclobutene polymer, polyperfluorocyclobutene aromatic ether, polyimide, polyallyl ether, perylene, hydrogenated diamond, polytetrafluoroethylene or the like. Further, the organic Low-k film layer 203 can be formed by appropriately employing silica-added polyimide, divinyl siloxane benzocyclobutene polymer, wherein silica is partially substituted in an organic polymer and so on. A Low-k film refers to a film made of a material having a dielectric constant smaller than 4, which is a dielectric constant of silicon dioxide. Moreover, a material for the first hard mask layer is not limited to a specific one. Appropriately employed instead of silicon dioxide can be, e.g., a silicon nitride film, an insulating material such as porous silica, silicon carbide or siliconoxynitrides, metal nitride such as titanium nitride or tantalum nitride, titanium carbon or the like. The material for the second hard mask layer is not limited to a specific one. Appropriately employed in lieu of silicon nitride can be, e.g., an insulating material such as silicon oxide, silicon carbide, porous silicon nitride, siliconoxynitride, aluminum nitride or silica, metal nitride such as titanium nitride or tantalum nitride, titanium carbide or the like. However, in case of using a conductive nitride film such as a titanium nitride film or a tantalum nitride film, the conductive nitride film should be removed by CMP or dry etching after burying Cu in a trench or a via hole.

Figure 2B:
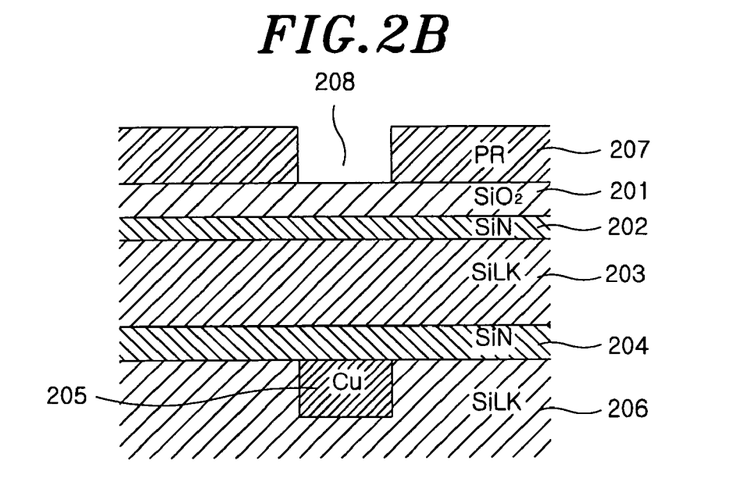
Figure 2C:
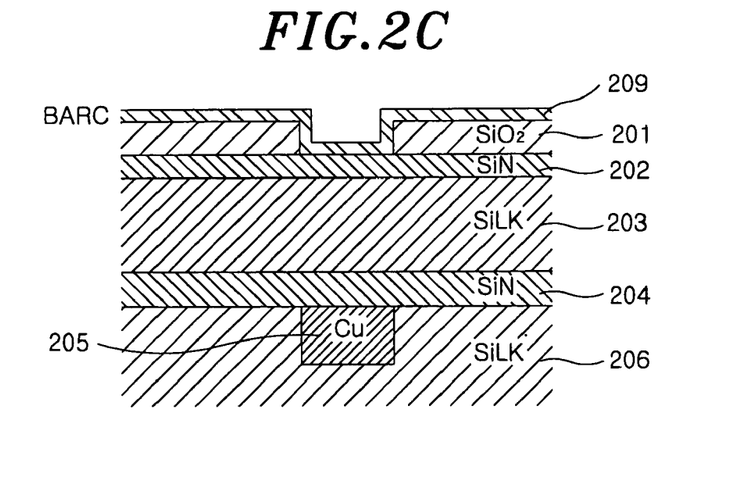

Next, a PR layer 207 (film thickness: e.g., 450 nm) is formed on the $SiO_2$ film layer 201 of the wafer shown in FIG. 2A and then a pattern 208 for use in fabricating a trench is formed by a lithography process as shown in FIG. 2B. Thereafter, by etching the $SiO_2$ film layer 201 according to the pattern 208 by employing an etching gas (for example, a gaseous mixture of $C_5F_8/O_2/Ar$) having a high selectivity against the SiN film layer 202, the SiN film layer 202 is exposed, so that a trench pattern is formed. Subsequently, the etching gas is switched to, e.g., an $O_2$ gas and the PR layer 207 is treated by ashing. Then, an antireflection film layer (a bottom antireflection coating (BARC) layer) 209 (film thickness: e.g., 60 nm) 209 is formed on the $SiO_2$ film layer 201 as shown in FIG. 2C. A material for the BARC layer 209 is not limited to a specific one, but an organic material, e.g., AR2-600 and AR3-200 (manufactured by SHIPLEY FAREAST CO., LTD), SEK-ex4 (manufactured by TOKYO OHKA KOGYO CO., LTD) or the like, can be appropriately employed.

Figure 3A:
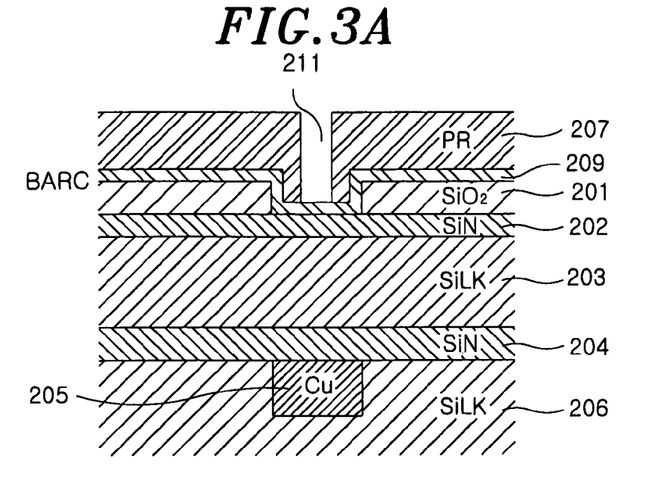
FIGS. 3A to 3C set forth cross sectional views showing a process for forming a hard mask for use in forming a via hole by using the plasma processing device shown in FIG. 1.
Figure 3B:
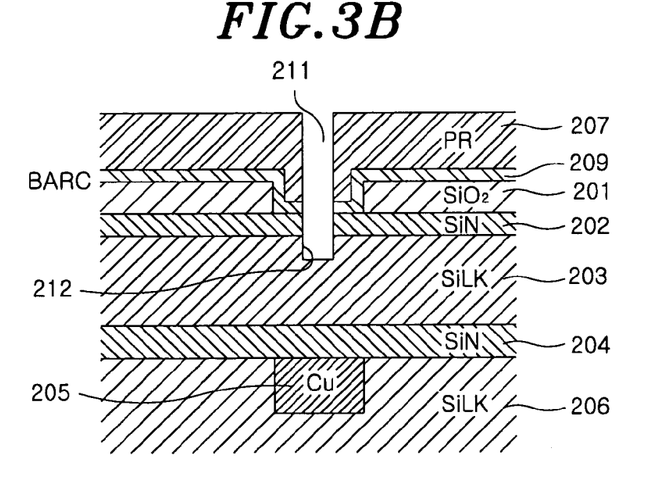
Figure 3C:
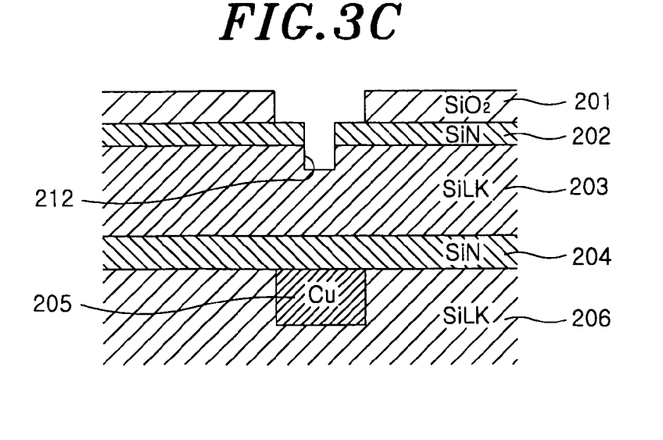

After forming a PR layer 210 on the BARC layer 209, a pattern 211 for use in forming a via hole is formed by a lithograph process as shown in FIG. 3A. After switching the etching gas to an etching gas (for example, a gaseous mixture of $CH_4/AR/O_2$) having a high selectivity against the PR layer 210, the BARC layer 209 and the SiN film layer 202 are etched according to the pattern 211 as illustrated in FIG. 3B. Further, the SiLK film layer 203 is also overetched down to a predetermined depth (for example, at least a depth corresponding to a shoulder portion of the dual damascene structure).

Afterwards, the PR layer 210 and the BARC layer 209 are removed by carrying out an etching process employing the etching method of the present invention. Employed as an etching gas in this process is a gas having a high selectivity against the $SiO_2$ film layer 201 and the SiN film layer 202, i.e., a first gaseous mixture of a gas containing N and H (e.g., $NH_3$), a CF-based gas (e.g., $CH_3F$, $CH_2F_2$, $CHF_3$, $C_4F_6$, $C_4F_8$, $C_5F_8$, etc.) and an $O_2$ gas or a second gaseous mixture of a $N_2$ gas, a $H_2$ gas and a CF-based gas (e.g., $CH_3F$, $CH_2F_2$, $CHF_3$, $C_4F_6$, $C_4F_8$, $C_5F_8$, etc.). In this process, a via hole 212 formed in the SiLK film layer 203 is concurrently further deepened while the PR layer 210 and the BARC layer 209 are being ashed as shown in FIG. 3C. By employing the first or the second gaseous mixture, it becomes possible to securely remove the PR layer 210 and the BARC layer 209 without leaving any resist residues on a trench portion of the SiN film layer 202 as in conventional cases, while concurrently etching the SiLK film layer 203 in a desired shape.

In case of using $NH_3/CH_3F/O_2$ as the first gaseous mixture, it is preferable that a flow rate ratio of $O_2/NH_3$ among the gaseous mixture is greater than 10/1500 but smaller than 300/1500. It is more preferable that a flow rate ratio of $CH_3F/NH_3$ is set to range from 1/1500 to 10/1500. If the flow rate ratio of $O_2/NH_3$ is equal to or smaller than 10/1500, etching residues may be generated and, if that is larger than 300/1500, a bowing is likely to be formed. Further, in case of using $N_2/H_2/CH_3F$ as the second gaseous mixture, a flow rate ratio of $CH_3F/(N_2+H_2)$ among the gaseous mixture is preferably set to range from 1/1800 to 10/1800.

Figure 4A:
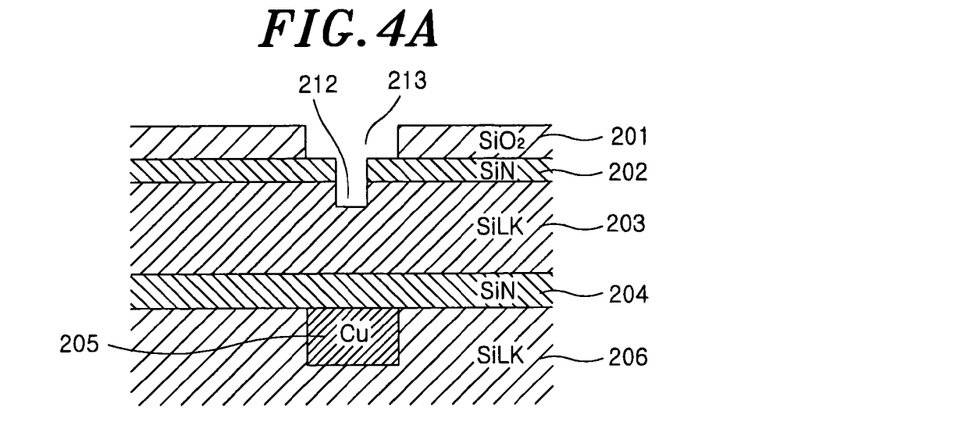
FIGS. 4A to 4C depict cross sectional views showing a process for forming a via hole and a trench by using the plasma processing device shown in FIG. 1.
Figure 4B:
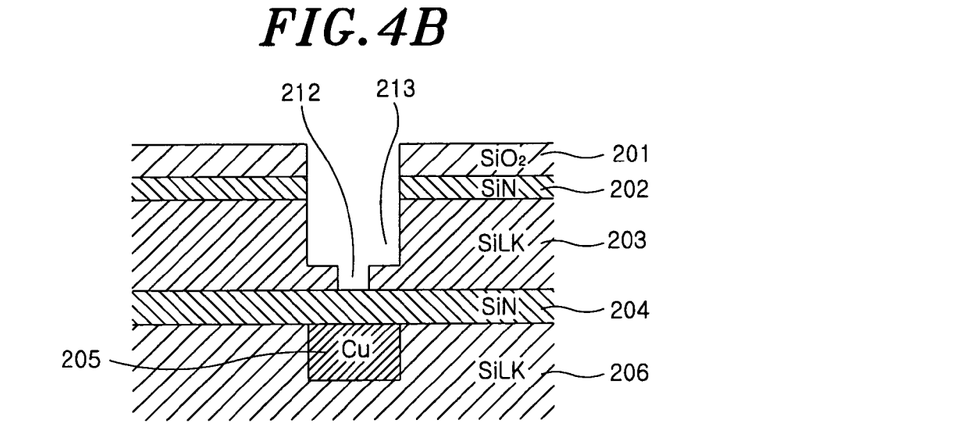

After removing the PR layer 210 and the BARC layer 209, the etching gas is switched to a gaseous mixture having a high selectivity against the $SiO_2$ film layer 201 (for example, $CH_2F_2/Ar/O_2$ or $CF_4/CH_2F_2/Ar/O_2$) and the SiN film layer 202 is etched by employing the $SiO_2$ film layer 210 as a hard mask, thereby forming a trench pattern 213 and, at the same time, further deepening the via hole 212 in the SiLK film layer. Further, through that process, there is formed a hard mask made of the $SiO_2$ film layer 201 and the SiN film layer 202 for use in a trench formation as shown in FIG. 4A. Subsequently, the etching gas is switched to an etching gas (e.g., $N_2/H_2$) having a high selectivity against both the $SiO_2$ film layer 201 and the SiN film layer 202, and the SiLK film layer 203 is etched by using the $SiO_2$ film layer 201 and the SiN film layer 202 as the hard mask, thereby deepening the trench 213 while concurrently deepening the via hole 212 until the via hole 212 reaches the underlying SiN film layer 204 as shown in FIG. 4B.

Figure 4C:
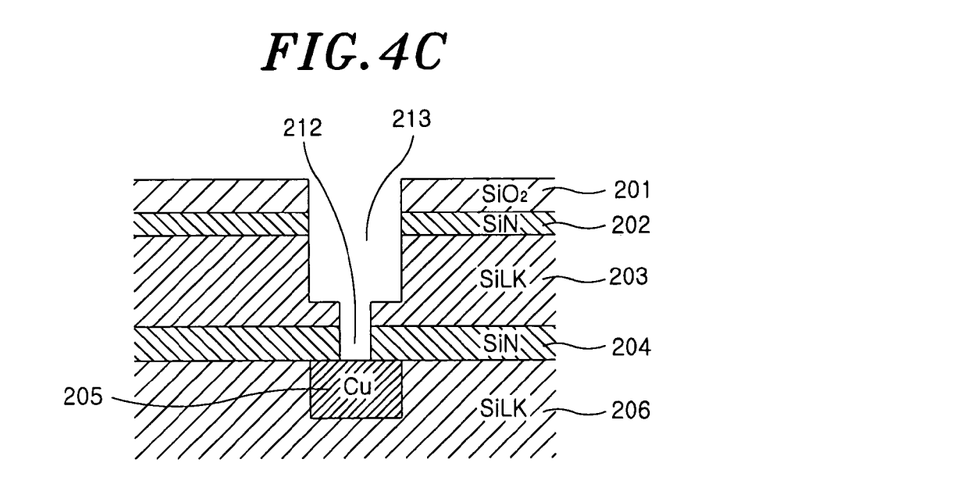

Next, as shown in FIG. 4C, the SiN film layer 204 provided on the Cu layer 205 is etched by employing a gaseous mixture (e.g., $CH_2F_2/Ar/O_2$) having a high selectivity against the hard mask, the SiLK film layer 203 and the Cu layer 205 until the via hole 212 passes through the SiN film layer 204. At this time, the trench 213 in the SiLK film layer 203 is further deepened as well.

Figure 5:
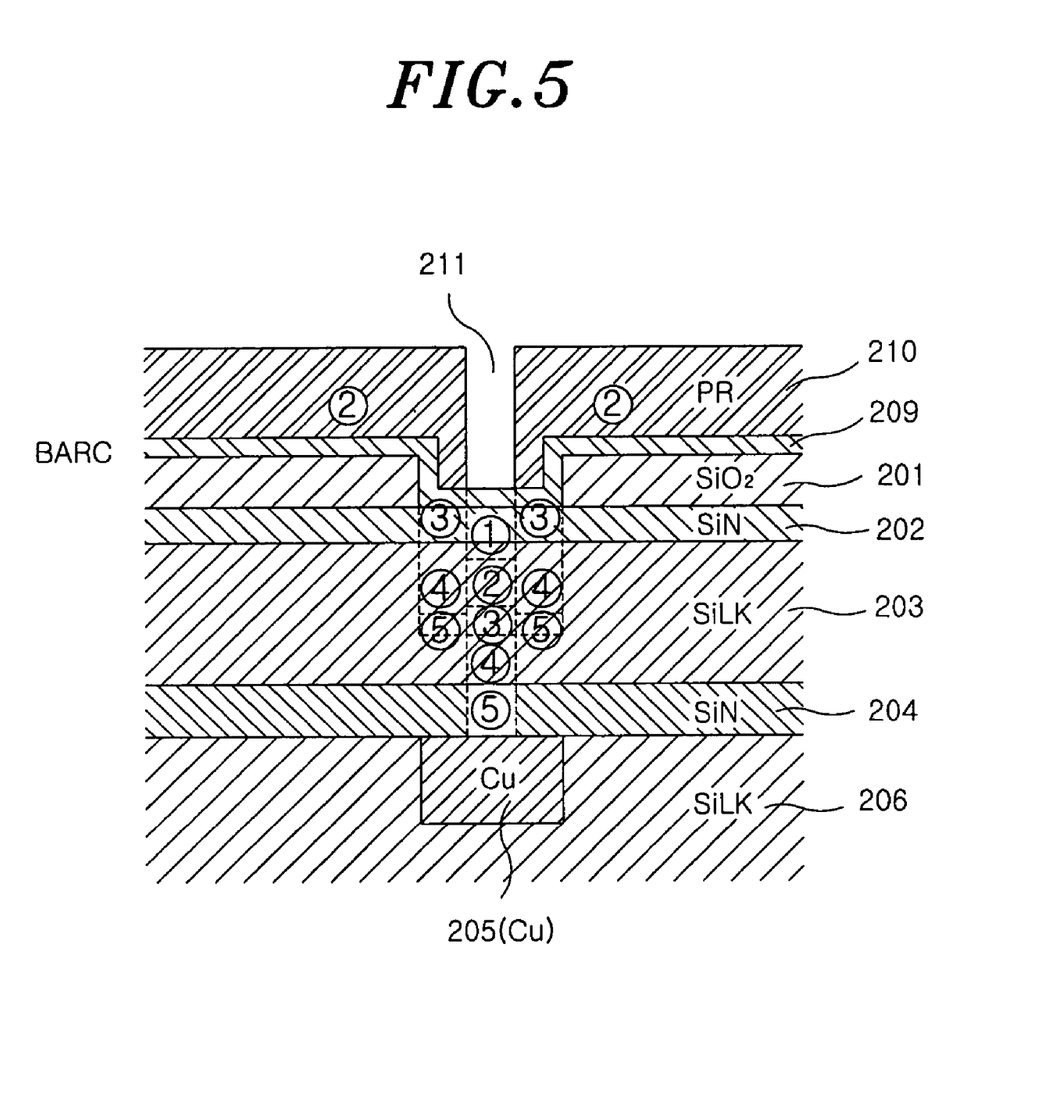
FIG. 5 offers a cross sectional view illustrating all the processes described in FIGS. 2A to 4C.

FIG. 5 illustrates the whole etching process described so far. Circled numbers therein represent the sequence of the etching processes. Through the series of the etching processes, the via hole 212 and the trench 213 of the dual damascene structure with a desired shape can be formed in the SiLK film layer 203. By burying a wiring material such as Cu in the via hole 212 and the trench 213, a wiring process is completed.

In accordance with the preferred embodiment of the present invention, in the process of forming the dual damascene structure based on the hard mask layers (the $SiO_2$ film layer 201 and the SiN film layer 202) formed underneath the organic film layers (the PR layer 210 and the BARC layer 209) and the SiLK film layer 203 formed under the hard mask layers, employed as the etching gas for the organic film layers made of the PR layer 210 and the BARC layer 209 and the SiLK film layer 203 is the first gaseous mixture of the gas containing N and H (e.g., $NH_3$), the CF-based gas (e.g., $CH_3F$, $CH_2F_2$, $CHF_3$, $C_4F_6$, $C_4F_8$, $C_5F_8$, etc.) and the $O_2$ gas or the second gaseous mixture of the $N_2$ gas, the $H_2$ gas and the CF-based gas (e.g., $CH_3F$, $CH_2F_2$, $CHF_3$, $C_4F_6$, $C_4F_8$, $C_5F_8$, etc.) as described above. Therefore, the PR layer 210 and the BARC layer 209 can be completely removed without leaving any resist residues on the trench portion of the SiN layer 202 and, at the same time, the etching of the via hole 212 having the desired shape can be carried out in the SiLK film layer 203. As a result, in a subsequent etching process of the trench portion of the SiN film layer 202, the poor shape resulting from the resist residues in etching the SiN film layer 202 and the residues generated in etching the SiLK film layer 203 can be surpressed.

Moreover, since the organic film layers include the PR layer 210 and the BARC film layer 209 formed underneath the PR layer 210, the pattern 211 for use in forming the via hole can be formed with a high precision in the photolithography process. In addition, since the hard mask layers include the SiN film layer 202, the trench 213 can be formed with a high precision by etching the SiN film layer 202 by using an etching gas having a high selectivity against the $SiO_2$ film layer 201. Furthermore, by employing $NH_3/CH_3F/O_2$ as the first gaseous mixture and setting the flow rate ratio of $O_2/NH_3$ to be larger than 10/1500 and smaller than 300/1500, the PR layer 210 and the BARC layer 209 can be securely removed.

In the following, there will be described specific examples of the processes shown in FIGS. 3B and 3C.

EXAMPLE 1

In this example, a part of a via hole 212 was formed by concurrently ashing the PR layer 210 and etching the SiLK film layer 203 for 26 seconds by using the first gaseous mixture ($NH_3/CH_3F/O_2$) as an etching gas in a plasma processing device corresponding to a 300 mm wafer under a processing condition specified below. As a result, there was found no resist residues on the SiN film layer 202 of a trench portion. Further, etching rates of the SiLK film layer and the PR layer were 6830 angstrom/min and 8605 angstrom/min, respectively and an in-surface etching uniformity of the of the PR layer 210 was ±5.2%, showing high etching rates and good in-surface etching uniformity of the PR layer 210.

[Processing conditions]
1. Inner pressure of the chamber: 400 mTorr
2. First high frequency power supply: 2 MHz, 3000 W
3. Second high frequency power supply: 60 MHz, 3000 W
4. Distance between an upper electrode and a lower electrode: 50 mm
5. Temperatures of B/T/W: 0° C./60° C./60° C. (B, T, and W representing temperatures of the lower electrode, the upper electrode and a sidewall of the chamber, respectively)
6. Pressure of a backside gas (center portion/periphery portion): 10/35 Torr
7. Etching gas: $NH_3/CH_3F/O_2$=1500/3/20 sccm

EXAMPLE 2

In this example, etching of the PR layer 210 and the SiLK layer 203 was conducted for 42 seconds by using a plasma processing device corresponding to the 300 mm wafer under the same processing condition as in example 1, excepting that the second gaseous mixture ($N_2/H_2/CH_3F$) was employed as an etching gas; a flow rate ratio was set to be $N_2/H_2/CH_3F$=1500/300/3 sccm; and an inner pressure of the chamber was set to be 300 to 400 mTorr. As a result, there was found no resist residues on the SiN film layer 202 of the trench portion. Furthermore, etching rates of the SiLK film layer and the PR layer were 3171 angstrom/min and 3265 angstrom/min, respectively, and an in-surface etching uniformity te of the PR layer 210 was ±27.2%.

COMPARATIVE EXAMPLE 1

In this comparative example, the PR layer 210 and the SiLK film layer 203 were etched for 23 seconds under the same processing condition as in Example 1, excepting that the first gaseous mixture having a flow rate of $O_2$ lower than that in Example 1 was employed as an etching gas and a flow rate ratio of $NH_3/CH_3F/O_2$ was set as 1500/3/10 sccm. As a result, there were found resist residues on the SiN film layer 202 of the trench portion. Etching rates of the SiLK film layer 203 and the PR layer 210 were 6887 angstrom/min and 8331 angstrom/min, respectively. An in-surface etching uniformity of the PR layer 210 was +6.6%.

COMPARATIVE EXAMPLE 2

In this comparative example, the PR layer 210 and the SiLK film layer 203 were etched for 27 seconds under the same processing condition as in Example 1, excepting that a gaseous mixture of $NH_3/CH_3F$ not including $O_2$ in the gaseous mixture of Example 1 was employed as an etching gas and a flow rate ratio of $NH_3/CH_3F$ was set to be 1500/3 sccm. As a result, resist residues were found in the trench. Further, etching rates of the SiLK film layer 203 and the PR layer 210 were 6975 angstrom/min and 8111 angstrom/min, respectively, and an in-surface etching uniformity of the PR layer was ±12.6%.

COMPARATIVE EXAMPLE 3

In this comparative example, a plasma processing device corresponding to a 200 mm wafer and a conventional gaseous mixture ($N_2+H_2$ gas mixture) were used to etch the PR layer 210 and the SiLK film layer 203 for about 45 seconds under the following processing condition. As a result, there were found resist residues on the SiN film layer 202 of the trench portion. Etching rates of the SiLK film layer and the PR layer were 2200 angstrom/min and 3700 angstrom/min, respectively, which are far lower than those obtained in Example 1. Further, an in-surface etching uniformity of the PR layer 210 was 10%.

[Processing condition]
1. Inner pressure of the chamber: 100 mTorr
2. First high frequency power: 2 MHz, 800 W
3. Second high frequency power: 6.0 MHz, 1500 W
4. Distance between the lower electrode and the upper electrode: 45 mm
5. Temperatures of B/T/W: 0° C./30° C./50° C.
6. Pressure of a backside gas (center portion/periphery portion): 10/35 Torr
7. Etching gas: $N_2/H_2$=300/300 sccm Further, the present invention is not limited to the preferred embodiment described above. Though the present invention has been described for the case of forming the via hole 212, it can be applied to any processes for completely removing an organic Low-k film layer and organic film layers for use in forming a wiring by way of etching an organic film layer formed on a hard mask layer for forming a wiring pattern simultaneously. Furthermore, the present invention can also be applied to a case of forming a trench structure. In addition, a material for each film layer of a dual damascene structure can be appropriately changed, if required. Further, an antireflection film layer may be formed on a PR layer.

In accordance with the present invention, there is provided an etching method capable of etching an organic interlayer insulating film layer in a desired shape without remaining resist residues in case of etching an organic film layer, e.g., a resist film layer or the organic interlayer insulating film layer, in a process of forming a wiring.

While the invention has been shown and described with respect to the preferred embodiment, it will be understood by those skilled in the art that various changes and modifications may be made without departing from the spirit and scope of the invention as defined in the following claims.

What is claimed is:

1. An etching method for forming a recess in a semiconductor structure including an organic film layer that includes at least one photo resist layer for use in fabricating a wiring pattern, a hard mask layer including a silicon nitride film layer and formed underneath the organic film layer, and an organic Low-k film layer formed below the hard mask layer, the method comprising the step of:
    etching the organic film layer and the organic Low-k film layer by employing an etching gas including a gaseous mixture of a $N_2$ gas, a $H_2$ gas and a CF-based gas to remove the photo resist layer without leaving residues thereof on the hard mask layer and the silicon nitride film layer being exposed after etching.

2. The method of claim 1, wherein the CF-based gas is a $CH_3F$ gas.

3. The method of claim 1, wherein the recess is a via hole structure.

4. The method of claim 1, wherein the recess is a trench structure.

5. The method of claim 1, wherein the recess is a dual damascene structure.

6. An etching method for forming a recess in a semiconductor structure including an organic film layer that includes at least one photo resist layer for use in fabricating a wiring pattern, a hard mask layer including a silicon nitride film layer and formed underneath the organic film layer, and an organic Low-k film layer formed below the hard mask layer, the method comprising the step of:
    etching the photo resist layer and the organic Low-k film layer by employing a gaseous mixture of a gas including N and H, a CF-based gas and an $O_2$ gas as an etching gas to remove the photo resist layer without leaving residues thereof on the hard mask layer and the silicon nitride film layer being exposed after etching.

7. The method of claim 6, wherein the gas including N and H is a $NH_3$ gas and the CF-based gas is a $CH_3F$ gas.

8. The method of claim 7, wherein a flow rate ratio of $O_2/NH_3$ is larger than 10/1500 and smaller than 300/1500.

9. The method of claim 8, wherein (a flow rate of the $CH_3F$ gas)/(a flow rate of the $NH_3$ gas) is from 1/1500 to 10/1500.

10. The method of claim 6, wherein the recess is a via hole structure.

11. The method of claim 6, wherein the recess is a trench structure.

12. The method of claim 6, wherein the recess is a dual damascene structure.

* * * * *

UNITED STATES PATENT AND TRADEMARK OFFICE
CERTIFICATE OF CORRECTION

PATENT NO. : 7,125,806 B2  Page 1 of 1
APPLICATION NO. : 10/490107
DATED : October 24, 2006
INVENTOR(S) : Harada et al.

It is certified that error appears in the above-identified patent and that said Letters Patent is hereby corrected as shown below:

On the title page, Item (87), the PCT Publication Date is incorrect. Item (87) should read:

-- (87) PCT Pub. No.: WO03/030237

PCT Pub. Date: Apr. 10, 2003 --

Signed and Sealed this

Tenth Day of July, 2007

JON W. DUDAS
*Director of the United States Patent and Trademark Office*